United States Patent [19]
Kaigawa

[11] Patent Number: 5,506,155
[45] Date of Patent: Apr. 9, 1996

[54] METHOD FOR MANUFACTURING A SUBSTRATE FOR SEMICONDUCTOR DEVICE USING A SELECTIVE GETTERING TECHNIQUE

[75] Inventor: Hiroyuki Kaigawa, Kyoto, Japan

[73] Assignee: Rohm Co., Ltd., Kyoto, Japan

[21] Appl. No.: 184,642

[22] Filed: Jan. 21, 1994

[30] Foreign Application Priority Data

Jun. 18, 1993 [JP] Japan ................................ 5-147349

[51] Int. Cl.$^6$ ................................................ H01L 21/306
[52] U.S. Cl. ...................................... 437/12; 148/DIG. 24
[58] Field of Search ............... 437/10, 12; 148/DIG. 24, 148/DIG. 60, DIG. 61

[56] References Cited

U.S. PATENT DOCUMENTS

| | | | |
|---|---|---|---|
| 4,559,086 | 12/1985 | Hawkins | 148/DIG. 24 |
| 4,561,171 | 12/1985 | Schlosser | 437/12 |
| 4,597,166 | 7/1986 | Iwai | 437/12 |
| 5,250,445 | 10/1993 | Bean et al. | 437/12 |

*Primary Examiner*—Chandra Chaudhari
*Attorney, Agent, or Firm*—Merchant, Gould, Smith, Edell, Welter & Schmidt

[57] ABSTRACT

It is an object of the present invention to provide a method for manufacturing a substrate for a semiconductor device which can increase efficiency of production of the substrate for a semiconductor device, and a method for manufacturing a substrate which can be utilized to produce a highly integrated semiconductor device. A polysilicon layer is formed on both the top surface and the bottom surface of the wafer (see FIG. 4B), before removing the polysilicon layer from the top surface of the wafer (see FIG. 4C). The polysilicon layer which remains on the bottom surface of the wafer is selectively removed, except in the device formation region (see FIG. 4D). Impurities (such as Fe or the like) contained in the wafer are trapped in distortion ST50 and distortion ST60 which occur between the wafer and the polysilicon layer. Since the polysilicon layer is formed separately on the bottom surface of the wafer, the tensile stress of the polysilicon layer is released. As a result, the wafer experiences less curvature, and it is possible to manufacture a substrate for the semiconductor device which can increase efficiency of production.

27 Claims, 9 Drawing Sheets

METHOD FOR MANUFACTURING A SUBSTRATE FOR SEMICONDUCTOR DEVICE USING A SELECTIVE GETTERING TECHNIQUE

BACKGROUND OF THE INVENTION

1. Field of the Invention

The present invention relates to method for a manufacturing a substrate for a semiconductor device and more particularly, gettering impurities in the substrate.

2. Description of the Prior Art

Generally, a semiconductor device is formed on a thin substrate referred to as a wafer. Often, the wafer contains impurities, such as, Fe, etc., therein. Once a semiconductor device is formed in a device formation region of the wafer which contains impurities, the formed semiconductor device operates erroneously.

To remove the impurities from the device formation region of the wafer, a layer is formed on the bottom surface of the wafer and distortions are caused between the wafer and the layer. As a result, the impurities are trapped in the distortions which are formed on the bottom surface of the wafer. Then, the semiconductor device is formed on the top surface of the wafer. This technique is referred to as "gettering" to those skilled in the art. When the gettering function is provided from outside of the wafer, it is referred to as EG(Extrinsic Gettering).

The mechanism of EG will be described below. FIG. 1A and FIG. 1B illustrate particles 10 of the polysilicon layer formed on the bottom surface of the wafer. For easy reference, FIG. 1A and FIG. 1B are shown upside down, meaning the bottom surface of the wafer is shown in the up side of the figures and the top surface of the wafer is shown in the down side of the figures. When growing a polysilicon layer on the wafer, the particles 10 of the polysilicon layer are grown as illustrated in FIG. 1B. At the same time, distortion ST1 occurs at a surface S1 of the wafer 1 where the wafer faces particles 10 of the polysilicon layer. Also, a distortion ST2 occurs at a surface S1 of the wafer 1 where the particles 10 of the polysilicon layer overlap each other. Contained impurities such as Fe, etc. of the wafer 1 are trapped in the distortions. That is, on carrying out heat treatment to the wafer 1 on which a polysilicon layer is formed, the contained impurities in the wafer 1 are effectively trapped in the distortions.

Next, conventional gettering is described. A poly silicon layer 20 is formed on top and bottom surfaces of wafer 1 as illustrated in FIG. 2A, utilizing the CVD(Chemical Vapor Deposition) method (see FIG. 2B), replace removing the polysilicon layer 20 on the top surface of the wafer 1 (up side of FIG. 2) by chemical etching the polysilicon layer 20 exists on the bottom side of the wafer 1 (see FIG. 2C). Then, the distortions occur between the polysilicon layer 20 and the wafer 1 (see FIG. 1B).

Incidentally, the wafer 1 has relative stress against the polysilicon layer 20 to inside (as shown in by arrow 200 of FIG. 3A and FIG. 3B), while the polysilicon layer 20 formed on the bottom surface of the wafer 1 has relative stress against the wafer 1 to outside (as shown in an arrow 200 of FIG. 3A and FIG. 3B). The discrepancies of these stresses between wafer 1 (the arrow 200) and the polysilicon layer 20 (the arrow 100), cause distortion ST10 and distortion ST20 (see FIG. 3A). Therefore, the impurities in the wafer are trapped in the distortion ST10 and distortion ST20.

When, heat treatment is carried out to the wafer 1 which is shown in FIG. 2C, the trapping of is accelerated and the impurities are trapped in the distortions more effectively. After the heat treatment, the polysilicon layer 20 is partially removed from the wafer 1.

However, wafer 1 has relative stress to the inside (the arrow 100 as shown in FIG. 3A and FIG. 3B), and the polysilicon layer 20 keeps relative stress to the out side (the arrow 200 as shown in FIG. 3A and 3B). Provided, the polysilicon layer 20 still exists after the partial removal on the bottom surface of the wafer 1 as it is shown in FIG. 2C, the wafer 1 receives stress as illustrated by an arrow 300 in FIG. 3B. This is due to discrepancies of stress direction between wafer 1 (compression stress represented by arrow 100 in FIG. 3A and FIG. 3B) and the polysilicon layer 20 (stretch stress represented by the arrow 200 in FIG. 3A and FIG. 3B). Once the wafer 1 receives the stress represented by the arrow 300, the wafer 1 curves slightly as shown in FIG. 3B. The stress represented by the arrow 300 causes curvature of the wafer 1 (see FIG. 3B). Furthermore, the heat treatment accelerates the stress represented by the arrow 300, so that the wafer 1 curves more as shown in FIG. 3C.

When the wafer 1 is curved as shown on FIG. 3C, it decreases the yield of semiconductor device production. Also the curved wafer affects the production steps of making a semiconductor device, especially the curvature affects the alignment step. The curvature of the wafer 1 causes misalignment between center the part of the wafer 1 and the edge part of the wafer 1. The misalignment to the wafer 1 decreases reliability of the semiconductor device, even when the curvature is slight. Accuracy of alignment is required, particularly for the steps of a highly integrated semiconductor device.

SUMMARY OF THE INVENTION

It is an object of the present invention to provide a method for a manufacturing a substrate for semiconductor device which will increase efficiency of production of the substrate for semiconductor device, and a method for manufacturing a substrate which can be utilized in the production of highly integrated semiconductor devices.

A method for manufacturing a substrate for a semiconductor device comprises the steps of;

a) forming a gettering layer on top and bottom surfaces of the substrate;

b) removing the gettering layer on the top surface of the substrate;

c) selectively removing the gettering layer on the bottom surface of the substrate.

While the novel features of the invention are set forth in a general fashion, both as to organization and content, the invention will be better understood and appreciated, along with other objects and features thereof, from the following detailed description taken in conjunction with the drawings.

DESCRIPTION OF THE PREFERRED EMBODIMENT

Figure 4A:
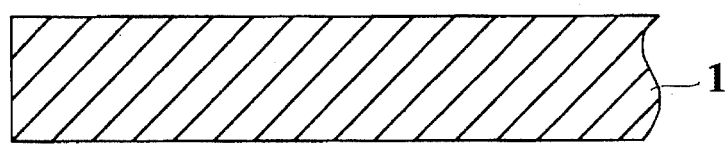
FIG. 4A–4D are views illustrating a method for manufacturing a substrate for a semiconductor device which is an embodiment of the present invention.
Figure 4B:
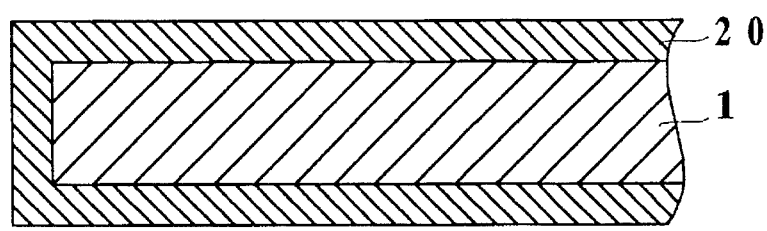

A method for manufacturing a substrate for semiconductor device according to the present invention is described below. In this embodiment for making a substrate for a semiconductor device, the aforementioned gettering layer is formed on the bottom surface of the substrate. In this case, a semiconductor device is formed on the top surface of the wafer. First, a polysilicon layer 20 is formed on both the top surface and the bottom surface of the wafer 1 as a gettering layer by the CVD(Chemical Vapor Deposition) method(see FIG. 4B). Then, a photo resist layer (not shown) is formed on the bottom surface of the wafer 1 where the polysilicon layer 20 has been formed. After forming the photo resist layer, the polysilicon layer 20 is removed from the top surface of the wafer 1 by chemical etching (see FIG. 4C).

Figure 4C:
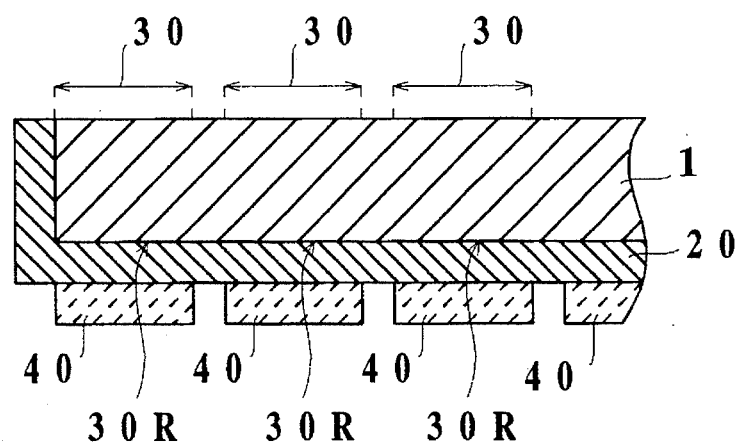

Subsequently, another photo resist layer 40 is formed on the opposite side of the device formation region 30 in which the device is formed as shown in FIG. 4C. Then, the polysilicon layer 20 is selectively removed from the bottom surface of the wafer 1, except opposite side 30R of device formation region 30 (see FIG. 4D). Removing the polysilicon layer 20 selectively from the bottom surface of the wafer 1 makes the polysilicon layer 20 only exist on opposite side 30R of device formation region 30. FIG. 5A shows an example of the existence of the polysilicon layer 20 which is formed selectively opposite side 30R of device formation region 30 on the bottom surface of the wafer 1. In this embodiment, the size of each one of the polysilicon layers 20 is approximately the same as a semiconductor device, for instance 10 mm by 20 mm rectangle shape.

Figure 4D:
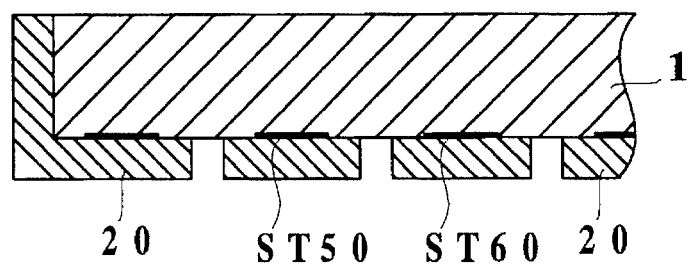
Figure 5A:
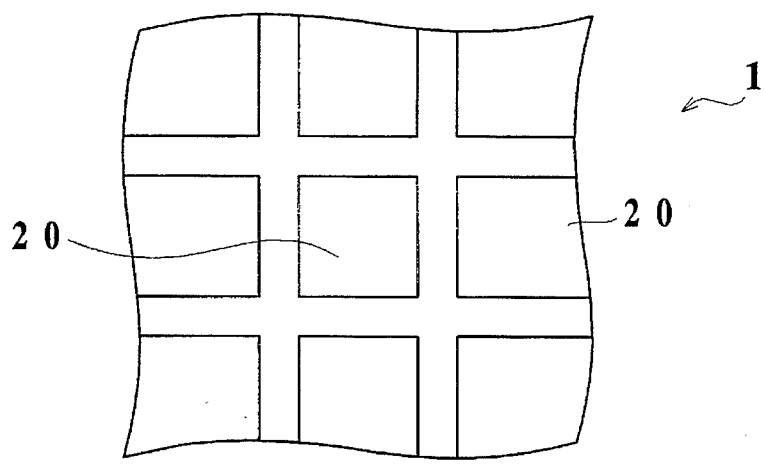
FIG. 5A–5C are views illustrating forms of a gettering layer which is formed on the bottom surface of the wafer 1, according to embodiments of the present invention.

Distortion ST50 and distortion ST60 occurred between the wafer 1 and the polysilicon layer 20 which are formed opposite side 30R of device formation region 30 (see FIG. 4D). Occurrence of the distortions causes stable absorption of impurities in the wafer 1. Therefore, purity of the device formation region 30 of the wafer 1 is increased. In addition to the purity at the device formation region 30, reliability of semiconductor device is also increased.

Figure 1A:
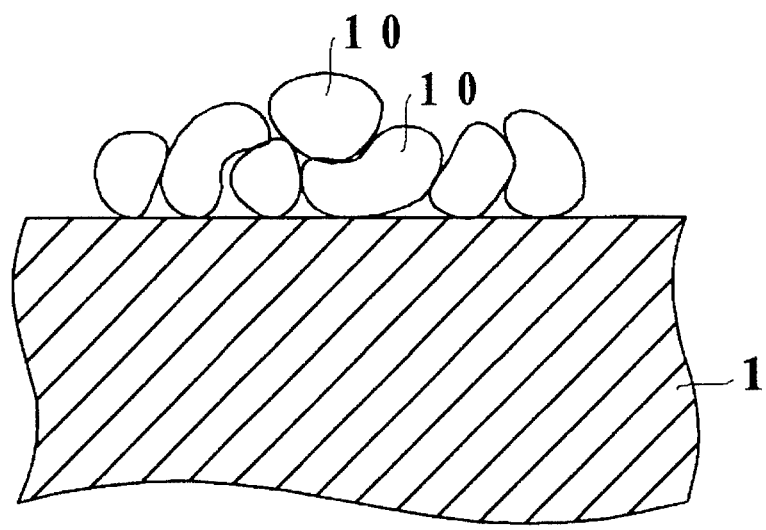
FIG. 1A–1B are enlarged views illustrating particles 10 of the polysilicon layer being formed on bottom surface of a substrate.
Figure 1B:
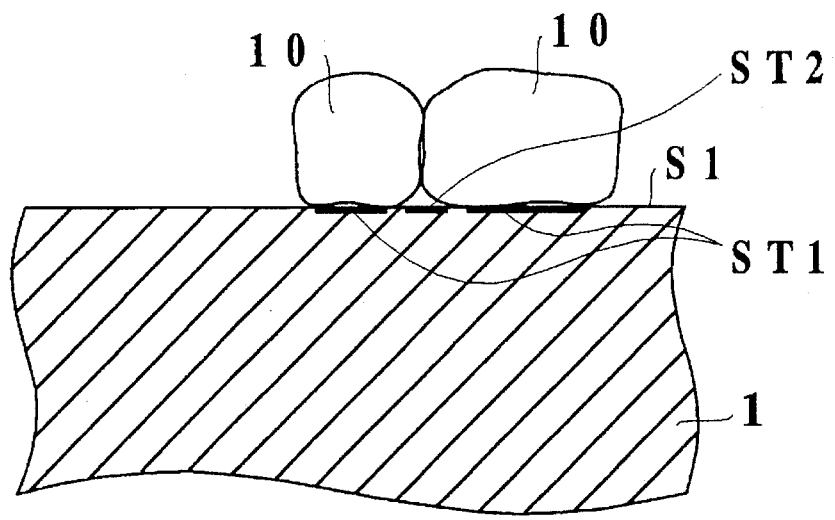
Figure 2A:
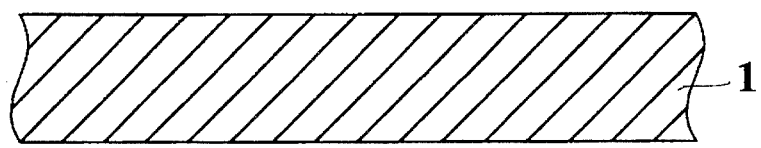
FIG. 2A–2C are views illustrating steps of a conventional method for manufacturing a substrate for a semiconductor device.
Figure 2B:
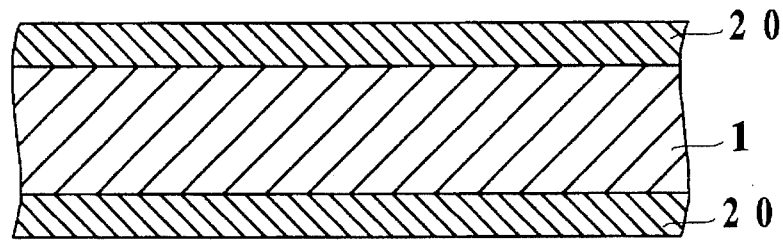
Figure 2C:
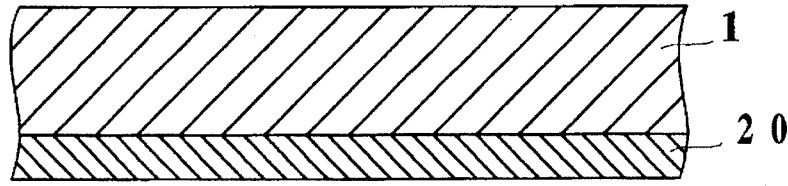
Figure 3A:
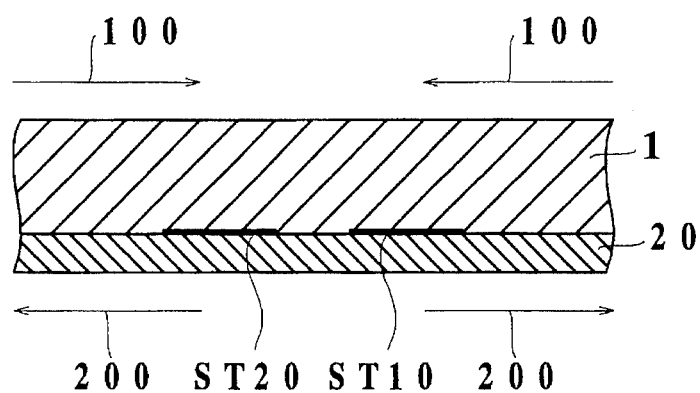
FIG. 3A–3C are views illustrating the direction of relative stresses between the polysilicon layer 20 and the wafer 1 in the conventional method, and curvature of the wafer 1.
Figure 3B:
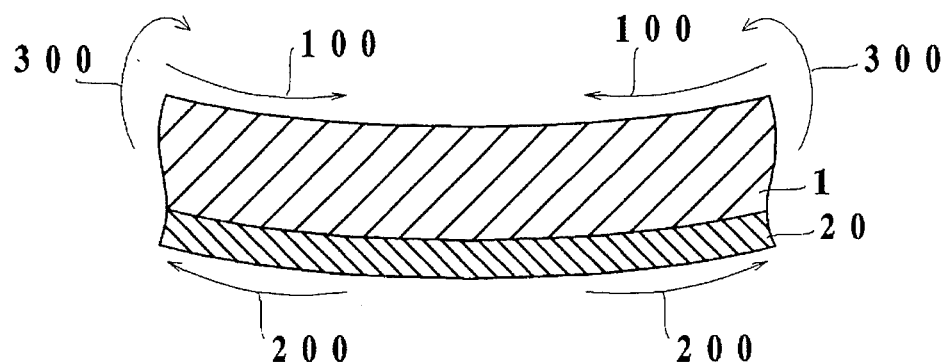
Figure 6:
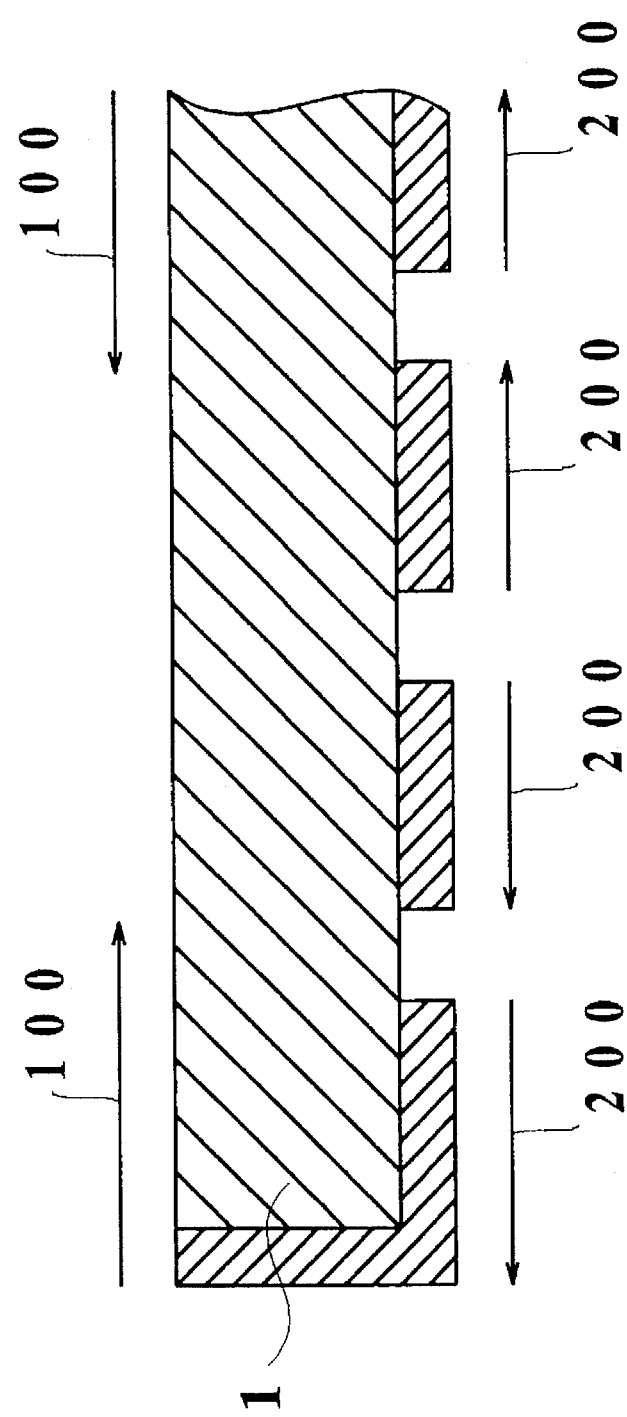
FIG. 6 is a view illustrating the direction of relative stresses between the polysilicon layer 20 and wafer 1 according to the present invention.

FIG. 6 illustrates the relationship of relative stress between the wafer 1 and the polysilicon layer 20 as shown in FIG. 4D. As described above, wafer 1 has compressive stress to the inside (direction of arrow 100), and the polysilicon layer 20 has tensile stress to the outside (direction of arrow 200). However, each tensile stress of the polysilicon layer 20 in this embodiment is released at each polysilicon layer 20 formed on the bottom surface of the wafer 1, (see FIG. 6). This is completely different from the wafer shown in FIG. 3B. That is forming the polysilicon layer as shown in FIG. 6 releases the tensile stress to the outside (direction the arrow 200) at intermediate locations, and the wafer does not develop relative stress as represented by arrow 300 (see FIG. 3B). Therefore, when carrying out heat treatment, preferrably at 1200° C. or less not much curvature is caused to the wafer 1.

As described above, the wafer 1 has less curvature than one made with the conventional method, and yield of semiconductor devices is much increased. Also, the wafer 1 can be utilized in production of highly integrated semiconductor devices due to the high accuracy of alignment.

Although, the polysilicon layer 20 on the bottom surface is removed selectively after removal of the polysilicon layer 20 from top surface of the wafer 1, the polysilicon layer 20 an both top surface and bottom surfaces can be removed (selectively) simultaneously, provided the polysilicon layers 20 can be removed in a predetermined fashion.

Another embodiment will be described below. In the aforementioned embodiment, polysilicon layers 20 are formed on both top surface and bottom surface of the wafer 1 (see FIG. 4B), and then polysilicon layer 20 which is formed on top surface of the wafer 1 is removed. After the removal of the polysilicon 20 from top surface of the wafer 1, the polysilicon layer 20 which is formed on the bottom surface of wafer 1 is selectively removed by chemical etching (see FIG.4C FIG. 4D).

Figure 7A:
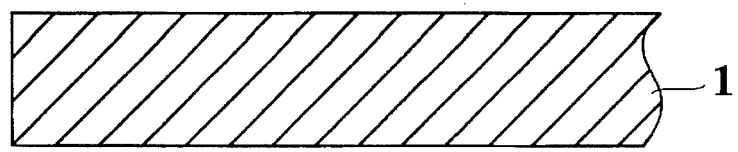
FIG. 7A–7C are views illustrating another embodiment according to the present invention of a method for manufacturing a substrate for a semiconductor device.
Figure 7B:
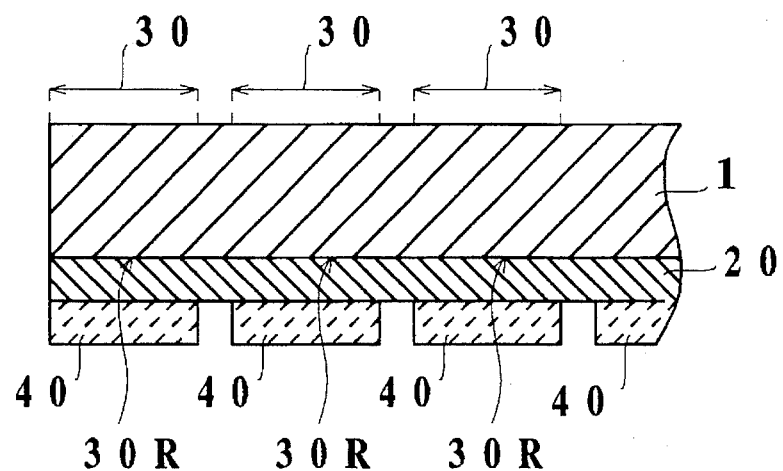
Figure 7C:
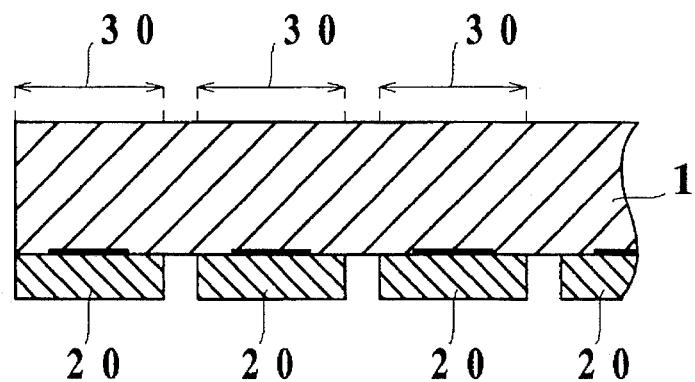

However, in the present embodiment a polysilicon layer 20 is formed on the bottom surface of the wafer as it is shown in FIG. 7A. Then, the polysilicon layer 20 is removed from the bottom surface of the wafer 1, except opposite side 30R of device formation region 30. This means the polysilicon layer 20 is formed only opposite side 30R of device formation region 30. The removal forms the polysilicon layer 20 in lattice shape (see FIG. 5A).

Figure 3C:
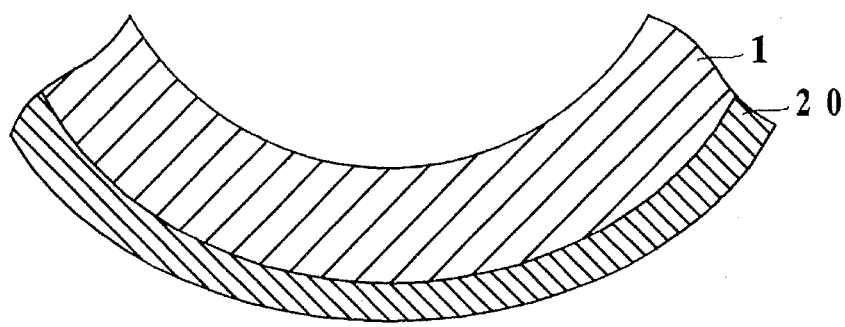

Subsequently, heat treatment preferrably at 1200° C. or less is carried out on the wafer 1 on which lattice shaped polysilicon layer 20 is formed. During and after the heat treatment, wafer 1 does not curve as it is shown in FIG. 3C. Furthermore, impurities (Fe etc,) which are contained in device formation region 30 are trapped into distortions which occurred between wafer 1 and opposite side 30R of the device formation region 30. Therefore, purity of the device formation region is increased. As a result, utilizing the wafer 1 in production of a semiconductor device contributes to improve the quality of the semiconductor device.

Under this embodiment, it is not necessary to carry out etching to the polysilicon layer 20 on the top surface of the wafer 1. Rather in forming the polysilicon layer 20 on the bottom surface of the wafer 1, the top surface of the wafer 1 is faced completely to a bench.

Another embodiment of the method for manufacturing a substrate for semiconductor device will be described below. With the aforementioned embodiments of the present invention, the polysilicon layer 20 has been removed selectively to form a gettering layer. However, under this embodiment, a polysilicon layer 20 is formed selectively on the bottom surface of the wafer 1.

Figure 8A:
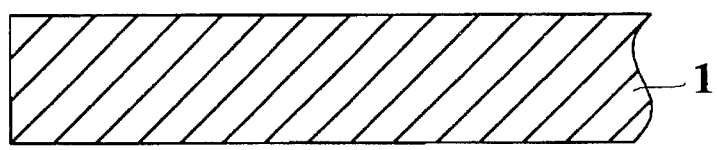
FIG. 8A–8C are views illustrating far yet another embodiment according to the present invention of a method for manufacturing a substrate for a semiconductor device.
Figure 8B:
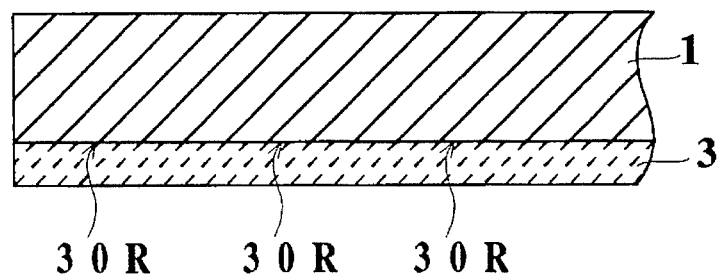
Figure 8C:
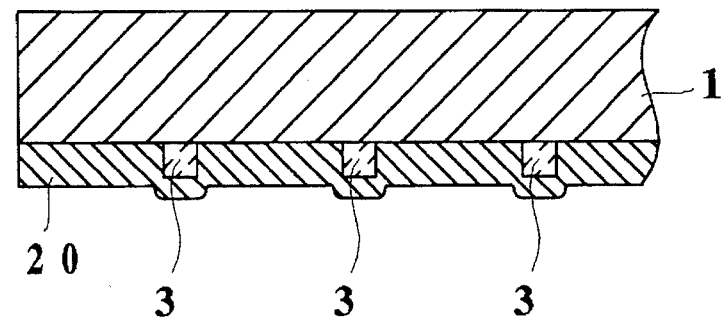
Figure 9A:
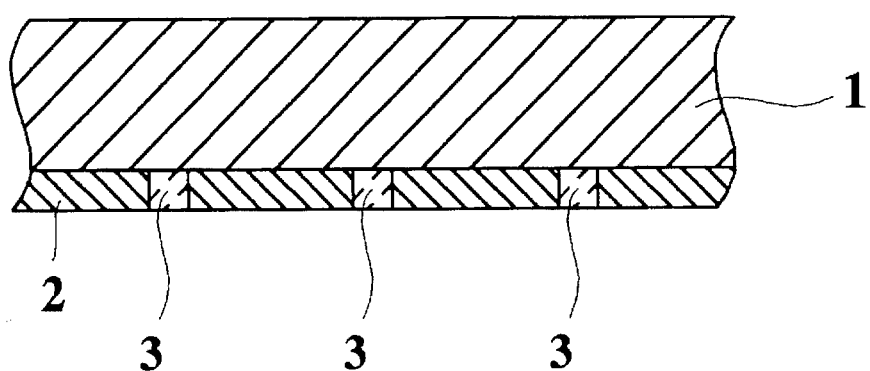
FIG. 9A–9B are views illustrating still another embodiment according to the present invention of a method for a manufacturing a substrate for semiconductor device.
Figure 9B:
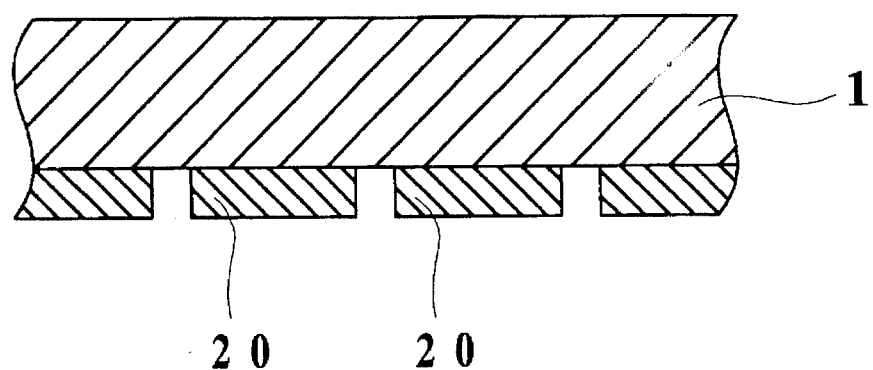

Initially, a silicon oxide layer 3 is formed on the bottom surface of a wafer 1 which is shown in FIG. 8A by heat oxidation (see FIG. 8B). Then, a resist layer 40 is formed on the silicon oxide layer 3 except opposite side 30R of device formation region 30. Chemical etching is then carried out to remove the silicon oxide layer 3 opposite side 30R of device formation region 30. After the removal, a polysilicon layer 20 is formed on the bottom surface of the wafer 1 (FIG. 8C). The polysilicon layer 20 is ground mechanically until the height of the silicon oxide layer 3 and the polysilicon layer 20 are to equal (FIG. 9A). After the grind, the silicon oxide layer 3 is removed by chemical etching utilizing aqueous hydrogen fluoride (FIG. 9B). By carrying out these steps, a lattice shaped polysilicon layer 20 is formed on the bottom surface of the wafer 1, as it is shown in FIG. 9A and FIG. 5A.

Through all the embodiments above, a polysilicon layer 20 is utilized as a gettering layer. However, a silicon nitride layer or a monocrystalline silicon layer is also applicable for the gettering layer, since it causes distortions at a surface of the wafer and traps impurities into the distortions. Furthermore, a layer is applicable for a gettering layer which has a different lattice constant than the wafer 1.

Figure 5B:
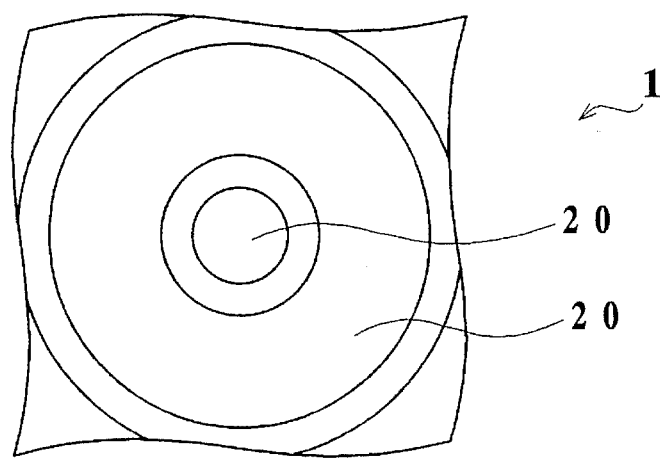
Figure 5C:
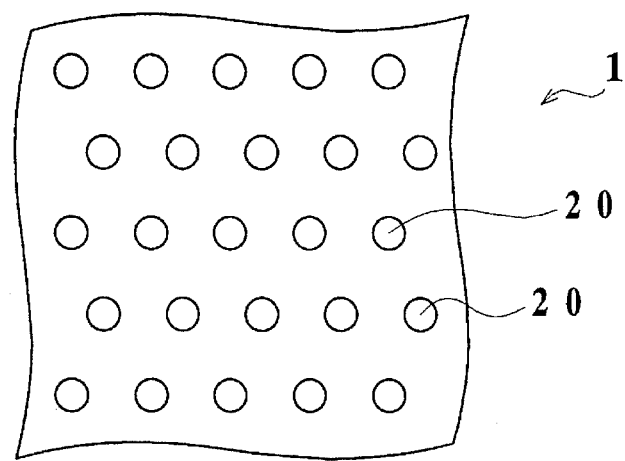

Moreover, all the above embodiments described that the polysilicon layer 20 is formed on the wafer 1 in lattice shape (see FIG. 5A). However, other shapes of gettering layers are possible, for instance, concentric circles and dotted shape, as shown in FIG. 5B and FIG. 5C can be applied instead of lattice shape; provided, that the other shapes of gettering layers cause the distortions to trap the impurities in the wafer, release relative stress to prevent curvature of the wafer. Also, size of the each gettering layer can be changed depending on the size of the semiconductor.

Although the invention has been described in its preferred form with a certain degree of particularity, it is understood that the present disclosure of the preferred form can be changed in the details of its construction and any combination and arrangement of parts may be resorted to without departing from the spirit and the scope of the invention as hereinafter claimed.

What is claimed is:

1. A method for manufacturing a substrate for a semiconductor device, comprising the steps of:
   a) preparing a substrate;
   b) forming a gettering layer which has a different lattice constant from the substrate, on top and bottom planar surfaces of the substrate;
   c) removing the gettering layer on the top surface of the substrate;
   d) selectively removing the gettering layer on the bottom surface of the substrate so that said gettering layer only exists on said substrate opposite a formation region for said semiconductor device.

2. A method for manufacturing a substrate for a semiconductor device in accordance with claim 1, wherein said gettering layer is a polysilicon layer.

3. A method for manufacturing a substrate for a semiconductor device in accordance with claim 1, wherein said gettering layer is a monocrystalline silicon layer.

4. A method for manufacturing a substrate for a semiconductor device in accordance with claim 1, wherein said gettering layer is a silicon nitride layer.

5. A method for manufacturing a substrate for a semiconductor device in accordance with claim 1, wherein said gettering layer is formed in a lattice shape.

6. A method for manufacturing a substrate for a semiconductor device in accordance with claim 1, wherein said gettering layer is formed in a concentric ring shape.

7. A method for manufacturing a substrate for a semiconductor device in accordance with claim 1, wherein said gettering layer is formed in dots.

8. A method for manufacturing a substrate for a semiconductor device in accordance with claim 1, wherein heat treatment is carried out after selectively removing the gettering layer on the bottom of the substrate.

9. A method for manufacturing a substrate for a semiconductor device in accordance with claim 8, wherein heat treatment is carried out at 1200° C. or less.

10. A method for manufacturing a substrate for a semiconductor device, comprising the steps of:
    a) preparing a substrate having a bottom planar surface;
    b) forming on selected portions of the bottom planar surface of the substrate a gettering layer which has a different lattice constant than the substrate; and,
    c) selectively removing the gettering layer.

11. A method for manufacturing a substrate for a semiconductor device in accordance with claim 10, wherein said gettering layer is a polysilicon layer.

12. A method for manufacturing a substrate for a semiconductor device in accordance with claim 10, wherein said gettering layer is a monocrystalline silicon layer.

13. A method for manufacturing a substrate for a semiconductor device in accordance with claim 10, wherein said gettering layer is a silicon nitride layer.

14. A method for manufacturing a substrate for a semiconductor device in accordance with claim 10, wherein said gettering layer is formed in lattice shapes.

15. A method for manufacturing a substrate for a semiconductor device in accordance with claim 10, wherein said gettering layer is formed in concentric ring shapes.

16. A method for manufacturing a substrate for a semiconductor device in accordance with claim 10, wherein said gettering layer is formed in dots.

17. A method for manufacturing a substrate for a semiconductor device in accordance with claim 10, wherein after selectively removing the gettering layer, heat treatment is carried out.

18. A method for manufacturing a substrate for a semiconductor device in accordance with claim 17, wherein the heat treatment is carried out at 1200° C. or less.

19. A method for manufacturing a substrate for a semiconductor device, comprising the steps of:
    a) preparing a substrate with a bottom surface;
    b) selectively forming on the bottom surface of the substrate an oxide layer;
    c) selectively forming on the bottom surface of the substrate on portions not covered by the oxide layer a gettering layer which has a different lattice constant than the substrate; and
    d) removing the oxide layer.

20. A method for manufacturing a substrate for a semiconductor device in accordance with claim 19, wherein said gettering layer is a polysilicon layer.

21. A method for manufacturing a substrate for a semiconductor device in accordance with claim 19, wherein said gettering layer is a monocrystalline silicon layer.

22. A method for manufacturing a substrate for a semiconductor device in accordance with claim 19, wherein said gettering layer is a silicon nitride layer.

23. A method for manufacturing a substrate for a semiconductor device in accordance with claim 19, wherein said gettering layer is formed in lattice shapes.

24. A method for manufacturing a substrate for a semiconductor device in accordance with claim 19, wherein said gettering layer is formed in concentric ring shapes.

25. A method for manufacturing a substrate for a semiconductor device in accordance with claim 19, wherein said gettering layer is formed in dots.

26. A method for manufacturing a substrate for a semiconductor device in accordance with claim 19, wherein after said gettering layer forming steps, heat treatment is carried out.

27. A method for manufacturing a substrate for a semiconductor device in accordance with claim 26, wherein the heat treatment is carried out at 1200° C. or less.

* * * * *